United States Patent [19]

Patron et al.

[11] Patent Number: 4,761,618

[45] Date of Patent: Aug. 2, 1988

[54] HIGH-FREQUENCY HEATING GENERATOR COMPRISING A MULTIPLE-GRID ELECTRON TUBE

[75] Inventors: Christian S. A. E. Patron; Aart P. Huben, both of Eindhoven, Netherlands

[73] Assignee: U.S. Philips Corporation, New York, N.Y.

[21] Appl. No.: 18,679

[22] Filed: Feb. 25, 1987

[30] Foreign Application Priority Data

Mar. 17, 1986 [NL] Netherlands ........................ 8600673

[51] Int. Cl.[4] ........................ H03B 5/10; H05B 6/02

[52] U.S. Cl. ................................ 331/167; 219/10.77

[58] Field of Search ............................ 331/167-171, 331/182; 219/10.75, 10.77, 61.2

[56] References Cited

U.S. PATENT DOCUMENTS 3,571,644 3/1971 Jakoubovitch .............. 219/10.75 X 3,733,454 5/1973 Schwartz ..................... 219/10.75 X 4,161,022 7/1979 Kanazawa et al. .......... 219/10.75 X

*Primary Examiner*—Eugene R. Laroche

*Assistant Examiner*—Robert J. Pascal

*Attorney, Agent, or Firm*—Thomas A. Briody; David R. Treacy; Bernard Franzblau

[57] ABSTRACT

A high-frequency heating generator comprising a multigrid electron tube 15 for use in industrial systems in the range of several kilowatts to a number of megawatts. In order to obtain an economic high-frequency generator, the electron tube 15 comprises at least two grids 152, 153; of which a first grid 153 is connected to a positive feedback circuit (15') of the oscillator circuit. A source of bias voltage may be supplied to the second grid 152. A low voltage control circuit (16) is connected to either the first (153) or second (152) grid, and the anode 151 is connected to a non-controlled d.c. power source (13, 14).

10 Claims, 1 Drawing Sheet

HIGH-FREQUENCY HEATING GENERATOR COMPRISING A MULTIPLE-GRID ELECTRON TUBE

BACKGROUND OF THE INVENTION

This invention relates to a high-frequency heating generator comprising an electron tube oscillator circuit, an electron-tube grid being connected to a positive feedback circuit of the oscillator circuit, and an electron tube anode being connected to a d.c. power source.

The present invention more specifically relates to high-frequency generators for industrial systems ranging from several kilowatts to a number of megawatts. High-frequency generators now being applied in industry are exclusively operated with the conventional usual triodes as an electron tube. Despite the fact that there are tetrodes on the market, they are not used in high-frequency or inductive heating generators, as for comparable power values it is considerably less expensive to incorporate triodes rather than tetrodes in the high-frequency generator.

The present invention is based on the idea that for a balanced cost analysis the entire high-frequency generator should be considered and not only the oscillator circuit.

Highly efficient power control of a triode requires a thyristor controller which can only be implemented in a simple manner for voltages up to 500 volts. However, for highly efficient use the triodes are required to operate at 10–50 kilovolts, making it necessary to incorporate a high-voltage transformer after the thyristor controller.

As a result of the use of a thyristor controller, the cost of the known high-frequency generator is not only higher than it would be if a thyristor controller could be dispensed with, but, in addition, in industrial systems the thyristor controller mostly requires a filter at the output of the high-voltage rectifier, which filter is not only costly but also voluminous due to the high voltage occurring there. In this connection, it should be observed that the production of plasma inevitably requires the use of a filter of this type as otherwise power variations in a plasma flame would cause a deafening noise.

SUMMARY OF THE INVENTION

An object of the invention is to provide a high-frequency generator which under no circumstances requires a thyristor controller.

To this end the present invention provides a high-frequency generator of the type mentioned in the preamble, characterized in that the generator comprises an electron tube with an additional grid as well as a low-voltage control circuit connected to the additional grid or to the electron-tube grid connected to the positive feedback circuit to set and/or control the generator output power. In case the low-voltage control circuit is connected to the electron tube grid connected to the positive feedback circuit, a setting voltage is applied to the additional grid and the d.c. power source is a non-controlled d.c. voltage source.

When implementing an electron tube comprising an additional grid in the high-frequency generator in accordance with the invention, the generator output power can be controlled using a low control power in a low-voltage control circuit connected to the additional grid or to the electron tube grid connected to the oscillator feedback circuit, which low-voltage control circuit provides amplitude control, instead of a high-voltage control circuit or chopper which is connected to the grid of the usual triode in the prior-art high-frequency generator.

The low-voltage control circuit is not only less expensive to implement but can also provide a larger and more accurate control range.

In certain cases the generator can be connected directly to the approximately 10 kilovolts high-voltage electricity supply source via a rectifier.

The low-voltage control circuit connected to an electron tube grid of the high-frequency generator in accordance with the present invention can comprise a transistor for relatively low power values, for example of the order of 100 Watts, there being applied to the transistor control electrode a control signal which is the result of a comparison of a reference signal with a feedback signal from the high-frequency generator, or an external circuit connected thereto.

In contradistinction to prior-art high-frequency generators, the power of a high-frequency generator in accordance with the invention can be easily controlled within a frequency range up to 100 megahertz, which is particularly advantageous for plasma applications.

BRIEF DESCRIPTION OF THE DRAWINGS

The invention will further be explained with reference to a possible embodiment and the drawings in which.

DESCRIPTION OF THE PREFERRED EMBODIMENTS

Figure 1:
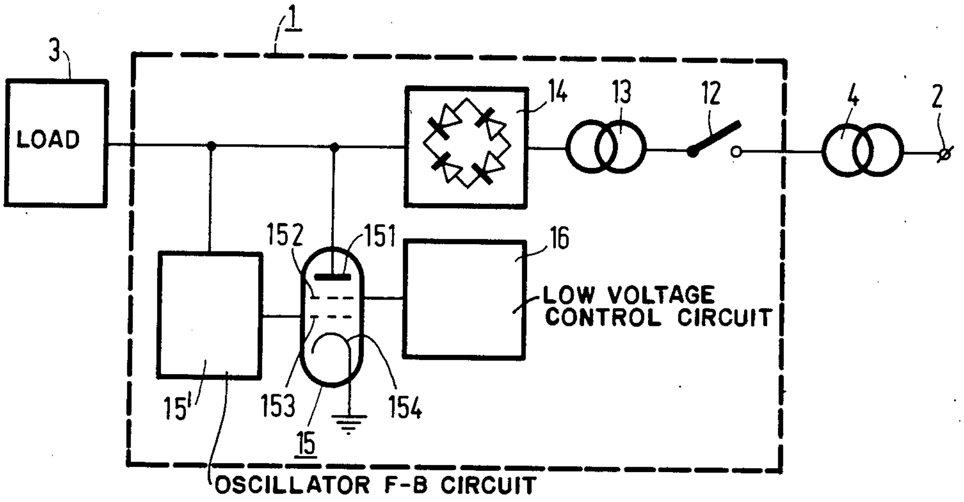
FIG. 1 shows a highly simplified and schematic circuit diagram of a high-frequency generator in accordance with the invention.

FIG. 1 shows a high-frequency generator 1 embodying the invention, incorporated between a mains connection 2 having an alternating voltage of, for example, 10 kilovolts and an external circuit 3 comprising for example one or a plurality of heating inductors or work coils (not shown) or a plasma torch (not shown). In the case of industrial use of high-frequency generators and also in the case shown of applying the high-frequency generator 1 in accordance with the invention, a high-voltage transformer 4 has been incorporated between the mains supply terminal 2 and the high-frequency generator 1, transforming the 10 kV mains voltage at the mains terminal 2 down to a 380 volts three-phase (power) voltage. For obvious purposes, the high-frequency generator 1 comprises a switch 12 and a high-voltage transformer 13 to transform the power voltage of 380 volts up to a high voltage of for example 10–15 kilovolts. In contradistinction to the high-frequency generator 1 in accordance with the invention, known high-frequency generators for industrial application comprise a thyristor controller between switch 12 and the high-voltage transformer 13 and a filter is incorporated after the high-voltage transformer 13. The generator in accordance with the invention possesses the advantage that the high-voltage transformer 4 as well as 13 can be dispensed with and replaced by an interconnection in the diagram of FIG. 1, in which case the switch 12 directly feeds the mains voltage of, for example, 10 kilovolts to a rectifier 14, which is otherwise connected to the high-voltage transformer 13.

The high-frequency generator 1 comprises an oscillator circuit 15', 15, of which only the electron tube, in this case a tetrode 15, is further depicted in the diagram of FIG. 1, as the portion 15', including a positive feedback circuit (not shown), is of common knowledge (cf. U.S. Pat. No. 3,448,407). The anode 151 of the tetrode 15 is connected to the rectifier 14 and to the portion 15' of the oscillator circuit. A first grid 153 is connected to the positive feed-back circuit (not shown) of the oscillator circuit portion 15' and a second or additional grid 152 of in this case tetrode 15 is connected to a low-voltage control circuit 16, which will be further discussed with reference to FIG. 2. A source of bias voltage can be connected to grid 152. It should be observed that the electron tube used in accordance with the invention can be a modified tube having one extra grid, but can also be an electron tube having more than one grid, such as a pentode. Differing from what is shown in FIG. 1, the low-voltage control circuit can be connected to the grid 153 of tetrode 15, instead of to grid 152 as shown in FIG. 1, in which case the bias voltage is applied still connected to the grid 152.

The series circuit including the high-voltage transformers 4 and 13 and rectifier 14, or with the rectifier 14 only, capable of being connected through the terminal 2 directly to the mains, can be considered a constant, non-controlled direct voltage source, as contrasted with a switching direct voltage source in the case of a prior-art thyristor controller. The invention under discussion not only saves using a thyristor controller, but in certain cases also saves costly and bulky filter circuits.

In other words, in operation a direct high-voltage of for example 10–15 kilovolts is applied to the anode 151 of electron tube 15, as is the case in the prior art. According to the invention, this is a basically constant high voltage, which can naturally be set but which is not used for controlling the high-frequency generator 1 output power.

According to the invention, the high-frequency generator 1 output power can be controlled by the low-voltage control circuit which is connected to the grid 153 or additional grid 152 of electron tube 15 and whose function it is to supply a signal having a controllable amplitude. In this connection it is only incidental to mention that for high-frequency generators for the intended fields of application, contrary to oscillators utilized in transmitters, it is essential for the output frequency to be load dependent and not fixed by, for example, a crystal, entailing basically different control means. With the low-voltage power control in accordance with the present invention, contrary to the prior art high-voltage power control, even when the high-frequency generator 1 is used in plasma torches in, for example, the manufacture of fiber optics from specially made quartz tubes, the accurate control required for this kind of application can readily be obtained. In addition, the entire system is lifted to a higher efficiency and as fewer components are incorporated, the system can be curtailed. As a tetrode has a shorter rise time than a triode, the high-frequency generator 1 in accordance with the present invention can advantageously be utilized in lasers to be modulated at high powers.

If the high-frequency transformers 4 and 13 are not used, this will result in a further improvement in the efficiency as a consequence of the absence of transformer losses.

Figure 2:
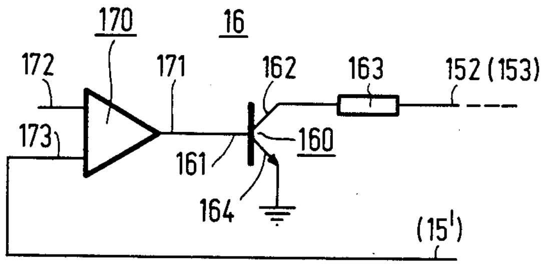
FIG. 2 shows a possible implementation of a low-voltage control circuit in the high-frequency generator of FIG. 1.

As stated above, FIG. 2 shows a highly simplified and schematic diagram of a possible implementation of the low-voltage control circuit 16. In this implementation, the low-voltage control circuit 16 comprises a control transistor 160 whose control electrode 161 is connected to the output 171 of a comparator circuit 170. A first input 172 of the comparator circuit 170 receives a setting signal, a second input 173 of the comparator circuit receiving a feedback signal from the high-frequency generator 1, possibly from the oscillator circuit portion 15' of FIG. 1. The output 171 of the comparator circuit 170 supplies a control signal which is the result of the comparison of the setting signal at input 172 of comparator circuit 170 with the feedback signal at input 173 of the comparator circuit 170.

A first main electrode 162 of the control transistor 160 is connected through a resistor 163 to the additional electrode 152 or electrode 153 of the electron tube 15 in the diagram of FIG. 1. A second main electrode 164 of the control transistor 160 is for example, grounded, possibly in the same manner as the cathode of the electron tube 15 as shown in the diagram of FIG. 1. It will be evident that the voltage level of for example the additional grid 152 of electron tube 15 in FIG. 1 will be proportional to the amplitude of the control voltage on the control electrode 161 of the control transistor 160.

In simple terms it can be stated that by using an electron tube comprising an additional grid, for example a tetrode, a thyristor controller with 6 or 12 high-energy thyristors and a bulky filter for smoothing the high-voltage delivered by the rectifier 14 in FIG. 1, in the case where a thyristor controller is used, can basically be replaced by not more than one (in this setup) low-voltage transistor in the low-voltage control circuit 160, 170.

As stated above, this will not only render the high-frequency generator less costly but also simple to realize.

What is claimed is:

1. A high-frequency heating generator comprising, an oscillator circuit including an electron-tube having a first grid connected to a positive feedback circuit of the oscillator circuit, means connecting an anode of the electron tube to a d.c. power source, characterized in that the electron tube has a second grid, a low-voltage control circuit having an output terminal connected to one of said first and second grids so as to control the generator output power.

2. A generator as claimed in claim 1, characterized in that the electron tube is a tetrode.

3. A generator as claimed in claim 1, wherein the low-voltage control circuit comprises a transistor having a first main electrode connected to one of said grids of the electron tube and a second main electrode connected to a reference potential, and a comparator circuit recieving at its first and second inputs a feedback signal and a setting signal, respectively, and supplying at its output, which is connected to a control electrode of the transistor, an output signal corresponding to the result of a comparison of the feedback signal with the setting signal.

4. A generator as claimed in claim 1 wherein said DC power source comprises a constant non-controlled DC power source.

5. A generator as claimed in claim 1 wherein the first grid is the control grid of the electron tube and the output of the low voltage control circuit is connected to the second grid, and said DC power source comprises a non-controlled DC power source whereby the output frequency of the generator is load dependent.

6. A generator as claimed in claim 5 wherein the low voltage control circuit comprises: a comparator having a first input which receives a setting signal and a second input that receives a feedback signal from said positive feedback circuit, and a control transistor having a control electrode coupled to an output of the comparator and an output elect4rode coupled to the output terminal of the low voltage control circuit.

7. A high-frequency heating generator comprising, an oscillator circuit that includes an electron tube having a first grid connected to a positive feedback circuit of the oscillator circuit and an anode connected to a DC power source, characterized in that the electron tube has a second grid, and a low-voltage control circuit having an output terminal coupled to the second grid to control the generator output power.

8. A generator as claimed in claim 7 wherein the low-voltage control circuit comprises a transistor having a first main electrode coupled to the output terminal of the control circuit and a second main electrode at a reference potential, and a comparator circuit receiving at its first and second inputs a feedback signal and a setting signal, respectively, and supplying at its output, which is connected to a control electrode of the transistor, an output signal corresponding to the result of a comparison of the feedback signal with the setting signal.

9. A high-frequency heating generator comprising, an oscillator circuit that includes an electron-tube having a first grid connected to a positive feedback circuit of the oscillator circuit and an anode connected to a DC power source, a low-voltage control circuit having an output terminal coupled to the first grid to control the generator output power, and means for applying a bias voltage to a second grid of the electron tube.

10. A generator as claimed in claim 9 wherein the low-voltage control circuit comprises a transistor having a first main electrode coupled to the output terminal of the control circuit and a second main electrode at a reference potential, and a comparator circuit receiving at its first and second inputs a feedback signal and a setting signal, respectively, and supplying at its output, which is connected to a control electrode of the transistor, an output signal corresponding to the result of a comparison of the feedback signal with the setting signal.

* * * * *